(12) United States Patent
Uhlemann et al.

(10) Patent No.: US 7,800,076 B2
(45) Date of Patent: Sep. 21, 2010

(54) ELECTRON-OPTICAL CORRECTOR FOR APLANATIC IMAGING SYSTEMS

(76) Inventors: Stephan Uhlemann, Guisbergstraβe 79, 69115 Heidelberg (DE); Harald Rose, Prinz-Christians-Weg 5 a, 64287 Darmstadt (DE); Heiko Müller, Häusserstr. 33, 69775 Heidelberg (DE)

( * ) Notice: Subject to any disclaimer, the term of this patent is extended or adjusted under 35 U.S.C. 154(b) by 150 days.

(21) Appl. No.: 12/297,306

(22) PCT Filed: Mar. 31, 2007

(86) PCT No.: PCT/DE2007/000586
§ 371 (c)(1),
(2), (4) Date: Nov. 17, 2008

(87) PCT Pub. No.: WO2007/118450
PCT Pub. Date: Oct. 25, 2007

(65) Prior Publication Data
US 2009/0134339 A1    May 28, 2009

(30) Foreign Application Priority Data
Apr. 15, 2006 (DE) ................ 10 2006 017 686

(51) Int. Cl.
*H01J 37/153* (2006.01)
(52) U.S. Cl. .............. 250/396 R; 250/396 ML; 250/310; 250/311
(58) Field of Classification Search ............ 250/396 R, 250/396 ML, 398, 310, 311
See application file for complete search history.

(56) References Cited

U.S. PATENT DOCUMENTS

| | | | | |
|---|---|---|---|---|
| 5,084,622 A | * | 1/1992 | Rose | 250/396 R |
| 6,605,810 B1 | * | 8/2003 | Haider et al. | 250/396 R |
| 6,861,651 B2 | * | 3/2005 | Rose | 250/396 R |
| 7,060,985 B2 | * | 6/2006 | Hosokawa | 250/396 R |
| 2008/0265172 A1 | * | 10/2008 | Uhlemann | 250/396 ML |

* cited by examiner

*Primary Examiner*—Jack I Berman
(74) *Attorney, Agent, or Firm*—Edwin D. Schindler

(57) ABSTRACT

A particle-optical corrector for eliminating both the third-order aperture aberration and the third-order extra-axial coma, using circular lenses and hexapole fields, includes three coaxially arranged hexapole fields, at least one circular lens doublet being arranged between adjacent hexapole fields and adjusted so that the center hexapole field is imaged on the hexapole fields. Between the hexapole fields, an intermediate plane prevails and the intermediate planes are conjugated with one another. The three hexapole fields are identically oriented in the Larmor reference system with the intensities of the three fields being chosen so that the image aberration coefficient of the astigmatism with three-fold symmetry becomes 0. The corrective contains two hexapole fields, in which the fields of the hexapole field pair are excited anti-symmetrically to one another, and the pairs are in each case arranged around the two intermediate planes. The orientation of the hexapole field pairs is rotated with respect to the orientation defined by the hexapole fields by a sufficient angle so that the extra-axial third order coma is corrected.

19 Claims, 1 Drawing Sheet

ELECTRON-OPTICAL CORRECTOR FOR APLANATIC IMAGING SYSTEMS

BACKGROUND OF THE INVENTION

1. Technical Field of the Invention

Figure 1:
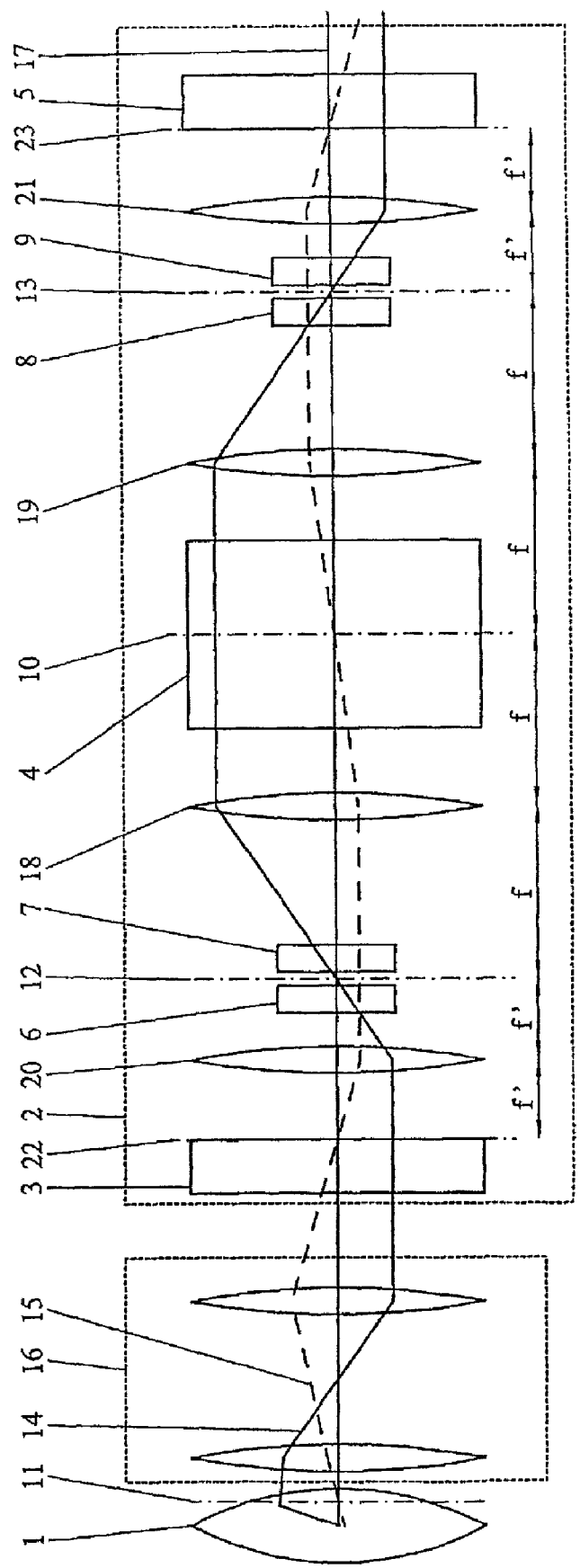

The invention relates to a particle-optical corrector for eliminating both the third-order spherical aberration and the third-order extra-axial coma using circular lenses and hexapole fields.

2. Description of the Prior Art

The efficiency of high-resolution imaging electron-optical systems, such as, for example, in high-resolution electron microscopy, is limited by third-order aperture aberrations. Therefore, it is a principal concern in the development of such systems to eliminate third-order spherical aberration. Another important criterion in the efficiency, besides high resolution, is to be able to image an image region of sufficient size. Its limit is determined in high-resolution electron-optical systems by the aberration of extra-axial coma, which is composed of the components of radial coma, often also described as isotropic coma, and of azimuthal coma, which is also known as anisotropic coma. Accordingly, the terms radial and azimuthal are used in one terminological system, and isotropic and anisotropic in the other terminological system. According to the conventional terminology, electron-optical imaging systems that contain no third-order spherical aberration and no extra-axial coma are termed aplanats. Derived from this, systems are termed semi-aplanats if, besides absence of third-order spherical aberration, they are only free of radial (isotropic) coma. In the case of electron-optical systems with a straight axis and circular Gaussian ray path, which are always assumed to be the case below, the third-order aperture aberration consists of the third-order spherical aberration. The term spherical aberration covers all those optical image defects whose aberration integrals include only those Gaussian elementary paths that emerge from the optical axis in the object plane to be imaged. The magnitude of the object/image field to be imaged is determined by extra-axial aberration, that is to say those aberrations whose aberration integrals also contain elementary paths according to Gaussian dioptrics that emerge in the object plane outside the optical axis. In high-resolution electron optics, the image aberration of extra-axial coma is the main factor limiting the image field.

German Patent Application DE 198 02 409 from the present applicant describes a corrective in which two hexapoles are used, between which a round-lens doublet is interposed. Between the corrective comprising these lenses and the objective lens, a further circular lens is interposed such that the coma-free plane of the objective lens is imaged in the coma-free plane of the corrective. But the term "coma-free plane", or more precisely "coma-free diaphragm plane", strictly speaking, describes the property "free of isotropic (radial) coma." A corrective of this construction thus permits the elimination of the third-order aperture aberration (3rd order aperture aberration) of the objective lens, avoiding the radial (isotropic) component of the extra-axial coma. According to the conventional terminology detailed above, the system, comprising objective lens, transfer system and corrective, in result represents a semi-aplanat.

SUMMARY OF THE INVENTION

In the above-described arrangement, it is a disadvantage that, as a result of the unavoidable anisotropic extra-axial coma of the magnetic objective lens, which is not influenced by the corrective, a restriction of the focused image region takes place, which could be considerably enlarged by complete elimination of this image aberration.

German Patent Application 10 2005 05 0810.3 from the present applicant describes a corrective in which three or more hexapole fields are used, between which a round-lens is interposed. These systems permit the simultaneous correction of the 3rd order aperture aberration and the 3rd order extra-axial coma, all hexapole fields being of comparable intensity and partly rotated with respect to one another. In this application, systems with three, five and six strong hexapole fields are described, the focal centers of the hexapole fields being imaged on one another by the circular lenses arranged between them. The systems with five and more strong hexapole fields have been recognized as disadvantageous because of their length and complexity. The system with only three strong hexapole fields does not offer the freedom to electrically adjust the corrective power by choosing the intermediate enlargement between the objective lens and corrective without the optical quality of the image being impaired. This restriction limits the applicability of these correctives to special applications in which an adaptation of the corrective power to the operating state of the imaging system can be dispensed with.

On this basis, it is the object of the invention to provide an electron-optical corrective which, besides elimination of the third-order spherical aberration, also has as its object elimination of the azimuthal (anisotropic) extra-axial coma, a special aim of the invention being to manage with a minimum number of strong hexapole fields and nevertheless to permit a free choice between the intermediate enlargement between the objective lens and corrective, and thereby an electrical adjustment of the corrective power.

This object is achieved according to the invention in that the corrector consists of three coaxially arranged hexapole fields, at least one circular lens doublet being arranged between adjacent hexapole fields and adjusted such that the center hexapole field is imaged on the hexapole fields, and thereby, between the hexapole fields, an intermediate plane prevails and the intermediate planes are conjugated with one another, and the three hexapole fields are identically oriented in the Larmor reference system, and the intensities of the three fields are chosen such that the image aberration coefficient of the astigmatism with threefold symmetry becomes 0 and that the corrective contains two hexapole fields, in which the fields of the hexapole field pair are excited antisymmetrically to one another, and the pairs are in each case arranged around the two intermediate planes, and the orientation of the hexapole field pairs is rotated with respect to the orientation defined by the hexapole fields by an angle such that the extra-axial 3rd order coma is corrected.

The intensity ratios of the hexapole fields are chosen such that the image aberration coefficients of the axial 2nd order astigmatism of three-fold symmetry becomes 0. The intensity parameter remaining after the intensity ratios have been set is used for adjusting the correction of the aperture aberration.

In addition, the corrective contains two pairs of hexapole fields for correction of the extra-axial 3rd order coma, which are arranged around the aforementioned intermediate planes. The intensities of the aforementioned hexapole field pairs are preferably lower by a factor of at least 10, but typically 50 to 100, than the other hexapole fields. The advantage of the low intensities of the hexapole field pairs consists principally in the simplicity of the constructional implementation.

The correction of the extra-axial 3rd order coma is effected by the two pairs of hexapole fields. The common orientation of these pairs relative to the orientation of the strong hexapole fields must be adjusted according to the extra-axial coma to be corrected. An especially preferred variant of the corrective serves for correction of the anisotropic (azimuthal) component of the extra-axial coma of a magnetic objective lens. In this special case, the weak hexapole fields are to be rotated about an angle of 30° measured in the Larmor system.

As explained above, the field intensities of the hexapole field pairs for coma correction are significantly weaker than those of the hexapole fields for aperture aberration correction. This property leads to an extensive decoupling of these degrees of correction freedom of the corrective, which is very favourable in practice.

In practice, the hexapoles are preferably kept spatially fixed and the hexapole field pairs are rotated relative to them by electrical or mechanical means until elimination of the image aberration of the extra-axial coma takes place. The procedure can be performed either by experimental adjustment or else by mathematical determination of the angle of rotation, and a consequent adjustment be made. In this manner, a corrective is obtained that, besides the third-order aperture aberration, also additionally permits the azimuthal component of the third order extra-axial coma to be eliminated.

Because of the existing axial magnetic fields, there is a rotation of the path of the electrons, in general the electrically charged particle stream. A simplification of the description of the physical conditions can be achieved by representation in a coordinate system that moves corresponding to the rotational motion of the electrons, and which is termed the Larmor reference system. The rotation of the hexapole fields described in the scope of this invention is always measured relative to the Larmor reference system.

The objective of a corrective consists in eliminating or at least reducing the image aberration of an objective lens, with which the corrective interacts. Thus, in the scope of the invention, it is in principle free whether the corrective and the transfer lens system are interposed before or after the lens. Below, the lens to be corrected, that is to say the objective lens, which will usually be a magnetic lens, is not mentioned, and primarily the construction of the corrective is described.

The axial three-leaf clover aberration is minimized if the adjustment of the circular lens doublet takes place such that the center plane of the center hexapole field is imaged on that entrance plane of the first and last hexapole field that in each case faces said hexapole field.

In the most general case, a telescopic beam path between the hexapoles is not necessary but advantageous. This measure simplifies the setting and adjustment of the corrector. Because of the existing symmetries/antisymmetries of the ray path, the numerous residual image aberrations are reduced and/or disappear.

A particularly preferred embodiment of the corrective is provided by means of a symmetrical arrangement of the optical elements with respect to the center plane of the system, the intensities of the circular lens fields and of the hexapole fields being symmetrical with respect to the center plane. In contrast to this, the excitation of the hexapole field pairs is antisymmetrical with respect to the center plane.

The trajectory of the axial fundamental path is adjusted so as to be symmetrical with respect to the center plane, while the extra-axial fundamental path has a trajectory that is antisymmetrical with respect to the center plane.

The symmetrical construction of the corrective and the symmetrical ray path are advantageous in that the axial three-leaf clover aberration (4th order aperture aberration with threefold symmetry), which is introduced by the corrective, remains small.

The axial three-leaf clover aberration that is still present in this system is a side-effect of the circular lenses of the corrective, which focus a particle beam with a threefold symmetrical cross-section. Complete correction of the axial aberration with threefold symmetry is achieved by means of an adapted modification of the circular lenses of the corrective. The geometry of the field-forming parts (magnetic gap) of the circular lenses, which face the center hexapole field, is changed such that the third-order aperture aberration of these circular lenses increases for the same refractive power. This is achieved by a reduction of the length of the magnetic gap and/or a reduction of the bore diameter. The lens current is reduced here in order to keep the refractive power of the lenses constant. By this measure, the residual three-leaf clover aberration of the system can be minimized or even completely compensated.

Furthermore, a particularly simple embodiment of the corrective results if the focal lengths of the two transfer lenses of the circular lens doublet are chosen to be f=f', in this special case, the effective length of the center hexapole field must be chosen so as to be twice the length of the outer hexapole fields. The hexapole field intensities of the outermost and center hexapole field are in this case the same. This choice of the length and intensity parameters achieves the required simultaneous disappearance of the axial 2nd order astigmatism of threefold symmetry and the 2nd order distortion of threefold symmetry in a particularly simple way. For this double-symmetrical construction, the trajectory of the axial fundamental path is additionally antisymmetrical to the intermediate planes and the trajectory of the extra-axial fundamental path is symmetrical to the intermediate planes.

If the focal lengths of the two transfer lenses of the circular lens doublet are in each case chosen so as to be different, the length and intensity of the center hexapole field is adjusted such that the required simultaneous disappearance of the axial 2nd order astigmatism with three-fold symmetry and the 2nd order distortion with three-fold symmetry again occurs. With the two free parameters of length ratio and intensity ratio, these two demands can always be mathematically satisfied. The double symmetry described above for the case of equal focal lengths f=f', is thereby lost, but with no disadvantages regarding the optical properties of the corrective. The realization of a focal length ration f/f'>1 is in addition technically advantageous, since, in this case, the length of the center hexapole field increases in comparison to the situation for f/f'=1 if the length of the outer hexapole fields remains unchanged. In this special case, it is favourable to excite the center hexapole field on a multipole element with 12-fold rotational symmetry. An additional dodecapole field can then be superposed on the same element, and serves to correct the 5th order astigmatism with six-fold symmetry. As a result, this measure further improves the optical resolution capability of the imaging system with corrective.

Mathematically, relationships can be given between the focal lengths $f_1$ of the outer (20, 21) and $f_2$ of the inner (18, 19) circular lenses and the lengths $L_1$ of the outer hexapole fields (3, 5) and $L_2$ of the center hexapole field (4), and the normalized intensities $H_1$ of the outer hexapole fields (3, 5) and $H_2$ of the center hexapole field (5). We are limiting ourselves to a simple model, in which the field gradient of the hexapole fields in the z-direction is approximated by a gradient that is constant in parts (box field). The requirement that the 2nd order axial astigmatism with three-fold symmetry becomes 0 then results in the condition:

$$2f_1^3 H_1 L_1 = f_2^3 H_2 L_2.$$

Likewise, the requirement that the 2nd order distortion with three-fold symmetry becomes 0 leads to the additional condition:

$$8H_1L_1^3/f_1 = H_2L_2^3/f_2.$$

When the focal length ratio $f_1/f_2$ is known, these equations determine the field-intensity ratio $$H_1/H_2 = (f_2/f_1)^5,$$

and the length ratio $$L_1/L_2 = \tfrac{1}{2}(f_1/f_2)^2$$

Generally, it must always be assumed that, in the real system, in comparison to the mathematical model, slightly deviating field-intensity values are lengths must be set or constructed, which is to be attributed to marginal field effects, material properties and the finite construction accuracy of the corrective.

The three hexapole fields are rotated relative to one another about the optical axis in the Larmor reference system. If the focal lengths of the transfer lenses are the same, and their construction is oriented symmetrically with respect to the center planes and their lens currents are oriented counter-directionally with respect to the intermediate planes, then the imaging of the circular lens doublets is distortion-free. Only in this case are the strong hexapole elements also unrotated with respect to one another, as measured in the laboratory system. If the circular lens double does not image rotation-free, a corresponding distortion of the center hexapole field relatively to the co-directionally oriented strong outer hexapole fields is to be provided in the laboratory system.

The generation of the hexapole field is basically free within the scope of the invention. The hexapole field is generated after the use of a multipole element with six-fold rotational symmetry. It is also possible to use a multipole element with twelve-fold rotational symmetry and to obtain a hexapole field by co-directional application to adjacent pole elements. Through retroactively changing the application of one individual pole element, rotation and adjustment of the electrical and/or magnetic hexapole field can be achieved while maintaining the mechanical positioning.

In one embodiment, finally, a circular lens is composed of two or more magnetic lens fields, such that the respective intensities are available as parameters for setting and adjusting. Such an arrangement generates a circular lens field that, with an appropriate choice of the respective intensity, enables the Larmor rotation, or the 3rd order aperture aberration of the circular lens to be adjusted in the desired manner while retaining the refractive power of the circular lens. This additional degree of freedom can be advantageously used for the electrical fine adjustment of the corrective.

For the transfer lens system between the corrector and objective, there are two alternatives:

The transfer lens system can consist of a single circular lens, which is to be adjusted as regards its intensity and position such that the coma-free plane of the object lens is imaged in the coma-free plane of the corrective.

The alternative consists in using a circular lens doublet as transfer lens system between the objective lens and corrector. Here, too, the adjustment takes place such that the coma-free plane of the objective lens is imaged in the coma-free plane of the corrective. These measures ensure that, in addition to the above-described image aberrations, the isotropic (radial) coma can be avoided. An arrangement is then obtained that possesses the properties of an aplanat.

The adaptation of the corrective power to the aperture aberration of the objective lens takes place either by adjusting all the hexapole field intensities or via the choice of intermediate enlargement between the objective lens and corrective.

For the possibility of correction, it is immaterial whether the corrective is arranged in the direction of the ray path and possibly with the interposition of transfer lenses behind the lens to be corrected, or whether the corrector and possibly any transfer lenses are arranged in front of the lens to be corrected. The aim is always, by adjusting the corrector or transfer lenses, to achieve a complete elimination of particular image aberrations of the entire optical system.

BRIEF DESCRIPTION OF THE DRAWING FIGURES

Further details, features and advantages of the invention can be taken from the following descriptive part, in which exemplary embodiments of the invention are explained with reference to the drawing, wherein FIG. 1 shows a corrector with hexapole fields and trajectory a fundamental paths

DETAILED DESCRIPTION OF THE DRAWING FIGURES AND PREFERRED EMBODIMENTS

FIG. 1 shows, in a schematic side view, the construction of an electron-optical arrangement, consisting of an objective lens 1, which is usually a magnetic circular lens, a corrector 2 and a transfer lens system 16 arranged between them. All these individual elements have optical axis 17 in common.

The corrector 2 contains a total of 3 hexapole fields 3, 7 and 8 and interposed circular lens doublets 18-21 which are arranged one behind the other. Around the planes 12, 13 of the intermediate images (=intermediate planes) there are arranged two pairs of hexapole fields 6-9; in the direction of the ray path there are a first hexapole field 3, which is shown as a rectangle, a first circular lens 20 with focal lens f'. The distance between the circular lens 20 and the emergence plane 22 of the hexapole field 3 corresponds to the focal length f' of the circular lens 20.

This is followed by a hexapole field pair 6, 7. The intermediate plane 12 between the hexapole fields 6, 7 is at a distance f from the circular lens 20 and at a distance f from the following circular lens 18 with focal length f. There then follows a further hexapole field 4, whose extent measured in the z-direction is longer than the extent of the first outer hexapole field 3. At a distance from the circular lens 18, the center plane 10 of the corrective is located in the center plane of the hexapole field 4. From here on, the construction continues symmetrically to the center plane 10. The hexapole fields 3, 10, 5 are oriented symmetrically to the center plane 10. With respect to this, the weak hexapole field pairs 6, 7, 8, 9 are oriented anti-symmetrically to the planes 10, 12, 13.

Between the objective lens 1 and the corrector 2, there is interposed a transfer lens system 6 consisting of two circular lenses. It is set in such a way that the coma-free plane 11 of the objective lens 1 is imaged in the coma-free plane 22 of the corrector 2. The axial fundamental path 14 and the extra-axial fundamental path 15 have the trajectory shown in the FIGURE. In the region of the corrective, null points of the axial fundamental path 14 lie in the center planes 12, 13 of the hexapole field pairs 6, 7 and 8, 9 of the correction of the extra-axial coma and null points of the extra-axial fundamental path 15 lie in the emergence plane 22 of the first hexapole field 3 and the center plane 10 of the hexapole element 4, and the entrance plane 23 of the hexapole field 5. By appropriate setting of the transfer lens system 16, in total, with corrector 2, a correction system is obtained that is capable of eliminating both the third-order aperture aberration and the extra-axial coma, namely both their isotropic (radial) and anisotropic (azimuthal) components.

The invention claimed is:

1. A particle-optical corrector for eliminating both a third-order aperture aberration and a third-order extra-axial coma using circular lenses and hexapole fields, comprising:
a corrector having three coaxially-arranged hexapole fields with intensities of said hexapole fields being selected so that an image aberration coefficient of an astigmatism with three-fold symmetry becomes zero and that said corrector contains two hexapole field pairs, wherein hexapole fields of each hexapole field pair of said two hexapole field pairs are excited anti-symmetrically relative to one another; and,
at least one circular lens doublet arranged between adjacent said hexapole fields and adjustable so that a center hexapole field of said hexapole fields is imaged on said hexapole fields for causing two intermediate planes to lie between said hexapole fields, said two intermediate planes being conjugated with one another and said three coaxially-arranged hexapole fields being identically oriented in a Larmor reference system, each said hexapole field pair being each being arranged around said two intermediate planes and an orientation of said hexapole field pairs being rotated relative to an orientation of said hexapole fields by an angle so that an extra-axial third order coma is corrected.

2. The particle-optical corrector for eliminating both a third-order aperture aberration and a third-order extra-axial coma using circular lenses and hexapole field according to claim 1, wherein a focal point of said center hexapole field is imaged on an entrance plane of said hexapole fields that is facing said center hexapole field.

3. The particle-optical corrector for eliminating both a third-order aperture aberration and a third-order extra-axial coma using circular lenses and hexapole field according to claim 1, wherein said three coaxially-arranged hexapole fields comprise a first hexapole field, a second hexapole field and a third hexapole field with a ray path being telescopic between said first hexapole field and said second hexapole field, and between said second hexapole field and said third hexapole field.

4. The particle-optical corrector for eliminating both a third-order aperture aberration and a third-order extra-axial coma using circular lenses and hexapole field according to claim 1, wherein said hexapole field pairs having intensity amounts to a maximum of one-tenth of the intensities of said hexapole fields.

5. The particle-optical corrector for eliminating both a third-order aperture aberration and a third-order extra-axial coma using circular lenses and hexapole field according to claim 1, wherein said hexapole field pairs are rotated in the Larmor reference system about an angle of ±30° relative to the orientation of said hexapole fields.

6. The particle-optical corrector for eliminating both a third-order aperture aberration and a third-order extra-axial coma using circular lenses and hexapole field according to claim 1, wherein said hexapole fields have a length ratio that is selected so that the image aberration coefficient of a second order distortion of three-fold symmetry becomes zero.

7. The particle-optical corrector for eliminating both a third-order aperture aberration and a third-order extra-axial coma using circular lenses and hexapole field according to claim 1, wherein said corrector is symmetrically constructed relative to a center plane and that the intensities of said hexapole fields are selected so that an axial fundamental path is symmetrical to the center plane of said center hexapole field and an extra-axial fundamental path is anti-symmetrical relative to the center plane.

8. The particle-optical corrector for eliminating both a third-order aperture aberration and a third-order extra-axial coma using circular lenses and hexapole field according to claim 1, wherein said hexapole fields have excitations selected to be symmetrical and said hexapole field pairs are selected to be anti-symmetrical relative to a center plane.

9. The particle-optical corrector for eliminating both a third-order aperture aberration and a third-order extra-axial coma using circular lenses and hexapole field according to claim 1, wherein said at least one circular lens doublet has focal lengths between said hexapole fields that are selected to be the same as one another and that fundamental paths are doubly symmetrical relative to a center plane of said corrector and said intermediate planes.

10. The particle-optical corrector for eliminating both a third-order aperture aberration and a third-order extra-axial coma using circular lenses and hexapole field according to claim 1, wherein said at least one circular lens doublet includes two circular lenses that are adjacent to said center hexapole field and are modified to have focal lengths that are the same, said two circular lenses have a larger aperture aberration coefficient than other circular lenses of said at least one circular lens doublet and are capable of permitting adjustment for elimination of a three-leaf-clover aberration.

11. The particle-optical corrector for eliminating both a third-order aperture aberration and a third-order extra-axial coma using circular lenses and hexapole field according to claim 1, wherein a hexapole field of said hexapole fields is generated by a multipole element with six-fold rotational symmetry.

12. The particle-optical corrector for eliminating both a third-order aperture aberration and a third-order extra-axial coma using circular lenses and hexapole field according to claim 1, wherein a hexapole field of said hexapole fields is generated by a multipole element with twelve-fold rotational symmetry.

13. The particle-optical corrector for eliminating both a third-order aperture aberration and a third-order extra-axial coma using circular lenses and hexapole field according to claim 1, wherein said center hexapole field is generated by a multipole element with at least twelve-fold rotational symmetry.

14. The particle-optical corrector for eliminating both a third-order aperture aberration and a third-order extra-axial coma using circular lenses and hexapole field according to claim 13, wherein on said multipole element, a dodecapole field is superimposed for correcting a six-fold astigmatism.

15. The particle-optical corrector for eliminating both a third-order aperture aberration and a third-order extra-axial coma using circular lenses and hexapole field according to claim 1, wherein said at least one circular lens doublet includes one circular lens that is comprised of at least two magnetic lens fields that are adjustable with respect to their respective intensities, so that their Larmor rotation, or their aperture aberration, is adjustable while maintaining refractive power of said one circular lens.

16. The particle-optical corrector for eliminating both a third-order aperture aberration and a third-order extra-axial coma using circular lenses and hexapole field according to claim 1, further comprising an objective lens and that in a direction of said objective lens, said objective lens is preceded by a transfer lens system comprising a circular lens and is adjustable for imaging a coma-free plane of said objective lens on a coma-free plane of said corrector.

17. The particle-optical corrector for eliminating both a third-order aperture aberration and a third-order extra-axial coma using circular lenses and hexapole field according to claim 1, further comprising an objective lens and that in a direction of said objective lens, said corrector is preceded by a transfer lens system that comprises a circular lens doublet that images a coma-free plane of said objective lens in a coma-free plane of the corrector.

18. The particle-optical corrector for eliminating both a third-order aperture aberration and a third-order extra-axial coma using circular lenses and hexapole field according to claim 1, further comprising an objective lens and a transfer lens system with a direction of a ray path being preceded by said objective lens and said transfer lens system.

19. The particle-optical corrector for eliminating both a third-order aperture aberration and a third-order extra-axial coma using circular lenses and hexapole field according to claim 1, further comprising an objective lens and a transfer lens system with a direction of a ray path being succeeded by said objective lens and said transfer lens system.

* * * * *